United States Patent

Asazawa et al.

[11] Patent Number: 5,844,437
[45] Date of Patent: Dec. 1, 1998

[54] DIFFERENTIAL FLIPFLOP CIRCUIT OPERATING WITH A LOW VOLTAGE

[75] Inventors: Hiroshi Asazawa; Jun Yoshida; Gohiko Uemura, all of Tokyo, Japan

[73] Assignee: NEC Corporation, Tokyo, Japan

[21] Appl. No.: 825,390

[22] Filed: Mar. 28, 1997

[51] Int. Cl.⁶ .................................................. H03K 3/289
[52] U.S. Cl. ........................ 327/202; 327/212; 327/218
[58] Field of Search ................................... 327/199–204, 327/208, 210–212, 214–219

[56] References Cited

U.S. PATENT DOCUMENTS

| | | | |
|---|---|---|---|
| 4,777,388 | 10/1988 | Widener | 327/202 |
| 4,975,595 | 12/1990 | Roberts et al. | 327/218 |
| 4,977,335 | 12/1990 | Ogawa | 327/218 |

FOREIGN PATENT DOCUMENTS

| | | | |
|---|---|---|---|
| 352034653 | 3/1977 | Japan | 327/215 |
| 357053136 | 3/1982 | Japan | 327/215 |
| 1132343 | 12/1984 | U.S.S.R. | 327/202 |

*Primary Examiner*—My-Trang Nu Ton
*Attorney, Agent, or Firm*—Whitham, Curtis & Whitham

[57] ABSTRACT

In a flipflop circuit, each of master and slave latch/hold circuits is constituted of differential pairs consisting of transistors each connected between VCC and VSS without being in series with another transistor between VCC and VSS. A clock driving circuit has a pull-down function responding to a pair of complementary clocks so as to pull down the level of a pair of complementary data signals supplied to each latch/hold circuit. With this arrangement, the flipflop circuit composed of bipolar transistors can operate with a low voltage of not greater than 1 V.

10 Claims, 10 Drawing Sheets

DIFFERENTIAL FLIPFLOP CIRCUIT OPERATING WITH A LOW VOLTAGE

BACKGROUND OF THE INVENTION

1. Field of the Invention

The present invention relates to a flipflop circuit, and more specifically to a differential flipflop circuit operating with a low voltage not greater than 2 V.

2. Description of Related Art

Referring to FIG. 1, there is shown a circuit diagram of one example of a conventional flipflop circuit, which will be called a first prior art flipflop circuit. The shown flipflop circuit includes a master latch/hold (LH) circuit 1, which constitutes a master flipflop, latching and holding a pair of complementary data signals D and $\overline{D}$ in synchronism with a pair of complementary buffered clocks BC and $\overline{BC}$, for outputting a pair of complementary master data signals M and $\overline{M}$, a slave latch/hold (LH) circuit 2, which constitutes a slave flipflop, latching and holding the pair of pair of complementary master data signals M and $\overline{M}$ in synchronism with the pair of complementary buffered clocks BC and $\overline{BC}$, for outputting a pair of complementary output data signals Q and $\overline{Q}$, and a clock buffer receiving a pair of complementary clocks C and $\overline{C}$, for outputting the pair of complementary buffered clocks BC and $\overline{BC}$.

The master LH circuit 1 is constituted of a double-balanced differential circuit (Gilbert circuit), which includes a pair of bipolar transistors Q11 and Q12 having their emitters connected in common to each other and their bases connected to receive the data signals D and $\overline{D}$, respectively, another pair of bipolar transistors Q13 and Q14 having their emitters connected in common to each other and their collectors connected to a collectors of the transistors Q11 and Q12, respectively, and each cross-connected to a base of the other of the pair of transistors Q13 and Q14, still another pair of bipolar transistors Q15 and Q16 having their emitters connected in common to each other and their collectors connected to the common-connected emitters of the transistors Q13 and Q14 and the common-connected emitters of the transistors Q11 and Q12, respectively, a base of the transistors Q15 and Q16 being connected to receive the pair of complementary buffered clocks BC and $\overline{BC}$, respectively. The common-connected collectors of the transistors Q11 and Q13 for outputting the inverted master data signal $\overline{M}$, and the common-connected collectors of the transistors Q12 and Q14 for outputting the non-inverted master data signal M, are connected to a power supply voltage VCC through load resistors R11 and R12, respectively. On the other hand, the common-connected emitters of the transistors Q15 and Q16 are connected to a power supply voltage VSS through a constant current source IS11.

Furthermore, the slave LH circuit 2 is also constituted of a double-balanced differential circuit, which includes a pair of bipolar transistors Q21 and Q22 having their emitters connected in common and their bases connected to receive the master data signals M and $\overline{M}$, respectively, another pair of bipolar transistors Q23 and Q24 having their emitters connected in common and their collectors connected to a collectors of the transistors Q21 and Q22, respectively, and each cross-connected to a base of the other of the pair of transistors Q23 and Q24, still another pair of bipolar transistors Q25 and Q26 having their emitters connected in common and their collectors connected to the common-connected emitters of the transistors Q23 and Q24 and the common-connected emitters of the transistors Q21 and Q22, respectively, a base of the transistors Q25 and Q26 being connected to receive the pair of complementary buffered clocks BC and $\overline{BC}$, respectively. The common-connected collectors of the transistors Q21 and Q23 for outputting the inverted output data signal $\overline{Q}$, and the common-connected collectors of the transistors Q22 and Q24 for outputting the non-inverted output data signal Q, are connected to the power supply voltage VCC through resistors R21 and R22, respectively. On the other hand, the common-connected emitters of the transistors Q25 and Q26 are connected to the power supply voltage VSS through a constant current source IS21.

The clock buffer 3 includes a pair of bipolar transistors Q31 and Q32 having their collectors connected in common to the power supply voltage VCC, and their bases connected to receive the pair of complementary clocks C and $\overline{C}$, respectively. Emitters of the transistors Q31 and Q32 are connected to the power supply voltage VSS through constant current sources IS31 and IS32, respectively, for outputting the pair of complementary buffered clocks BC and $\overline{BC}$. Therefore, each of the transistors Q31 and Q32 constitutes an emitter follower.

Now, operation of the first prior art flipflop circuit will be described with reference to FIG. 1.

When the non-inverted clock C is at a logical high level and the inverted clock $\overline{C}$ is at a logical low level, the transistors Q15 and Q26 of the master LH circuit 1 and the slave LH circuit 2 are turned on, and the transistors Q16 and Q25 are off. Therefore, the master LH circuit 1 is in a holding condition, and the slave LH circuit 2 in a latching condition. To the contrary, when the non-inverted clock C is at the logical low level and the inverted clock $\overline{C}$ is at the logical high level, the transistors Q15 and Q26 are off, and the transistors Q16 and Q25 are turned on. Therefore, the master LH circuit 1 is in the latching condition, and the slave LH circuit 2 in the holding condition. Thus, the shown circuit performs a flipflop operation.

The emitter followers constituted of the transistors Q31 and Q32 in the clock buffer 3, are provided for the purpose of setting the potential of the buffered clocks BC and $\overline{BC}$ supplied to the bases of the transistors Q15, Q16, Q25 and Q26 in a clock-driven differential circuit of a lower half stage of the double-balanced differential circuits, to a level which is lower than, by a base-emitter voltage VBE, that of the data signals supplied to bases of the transistors Q11–Q14 and Q21–Q24 in data processing differential circuits of an upper half stage of the double-balanced differential circuit.

As seen from the above, the first prior art flipflop circuit is constituted of the pair of double-balanced differential circuits each comprising the two stages which are connected in series between the power supply voltages VCC and VSS and which are respectively constituted of the data processing upper stage differential circuits composed of the transistors Q11–Q14 and Q21–Q24 and the clock-driven lower stage differential circuit composed of the transistors Q15 and Q16, and Q25 and Q26. In addition, the first prior art flipflop circuit is driven by the emitter follower circuits composed of the transistors Q31 and Q32. As a result, it is difficult to drive the flipflop circuit with a voltage of not greater than 1.5 V.

Referring to FIG. 2, there is shown a circuit diagram of one example of another conventional flipflop circuit, which will be called a second prior art flipflop circuit, which was proposed by U.S. Pat. No. 4,977,335 corresponding to Japanese Patent Application Laid-open Publication No. JP-A-2-021717 published on Jan. 24, 1990, for the purpose of overcoming the above mentioned disadvantage of the first prior art flipflop circuit. In FIG. 1, elements similar to those shown in FIG. 1 are given the same Reference Signs and Numerals, and explanation thereof will be omitted for simplification of description.

As seen from comparison between FIGS. 1 and 2, the second prior art flipflop circuit comprises, in place of the master LH circuit 1 and the slave LH circuit 2 of the first prior art flipflop circuit, a master LH circuit 1A and a slave LH circuit 2A which are similar in function to the data processing upper stage differential circuits of the double-balanced differential circuit of the first prior art flipflop circuit, respectively. Furthermore, the second prior art flipflop circuit comprises, in place of the clock buffer 3 of the first prior art flipflop circuit, a clock driving circuit 4 which is similar in function to the clock driven lower stage differential circuits of the double-balanced differential circuit and the clock buffer of the first prior art flipflop circuit.

The master LH circuit 1A comprises, in addition to the transistors Q11 to Q14 and the resistors R11 and R12, a resistor R13 connected between the power supply voltage VCC and the common-connected node of the resistors R11 and R12, and a pair of constant current sources IS12 and IS13 connected between the common-connected emitters of the transistors Q13 and Q14 and the power supply voltage VSS, and between the common-connected emitters of the transistors Q11 and Q12 and the power supply voltage VSS, respectively.

The slave LH circuit 2A comprises, in addition to the transistors Q21 and Q24 and the resistors R21 and R22, a resistor R23 connected between the power supply voltage VCC and the common-connected node of the resistors R21 and R22, and a pair of constant current sources IS22 and IS23 connected between the common-connected emitters of the transistors Q23 and Q24 and the power supply voltage VSS, and between the common-connected emitters of the transistors Q21 and Q22 and the power supply voltage VSS, respectively.

The clock driving circuit 4 includes a pair of bipolar transistors Q41 and Q42 having their emitters connected to each other, their bases connected to receive the clocks C and $\overline{C}$, respectively, and their collectors for outputting a pair of amplified clocks $\overline{CA}$ and CA, respectively, a pair of resistors R41 and R42 connected between the collector of the transistor Q41 and the power supply voltage VCC, and between the collector of the transistor Q42 and the power supply voltage VCC, respectively, and a constant current source IS41 connected between the common-connected emitters of the transistors Q41 and Q42 and the power supply voltage VSS.

The clock driving circuit 4 includes a pair of bipolar transistors Q43 and Q44 having their collectors connected in common to the power supply voltage VCC, their bases connected to receive in common the amplified clock CA, and their emitters connected to the common-connected connected emitters of the transistors Q11 and Q12 and the common-connected emitters of the transistors Q23 and Q24, respectively. The transistors Q43 and Q44 have a size larger sufficiently than that of each of the transistors Q11–Q14 and Q21–Q24.

Furthermore, the clock driving circuit 4 includes a pair of bipolar transistors Q45 and Q46 having their collectors connected in common to the power supply voltage VCC, their bases connected to receive in common the amplified clock $\overline{CA}$, and their emitters connected to the common-connected emitters of the transistors Q13 and Q14 and the common-connected emitters of the transistors Q21 and Q22, respectively. The transistors Q45 and Q46 have a size larger sufficiently than that of each of the transistors Q11–Q14 and Q21–Q24.

Now, operation of the second prior art flipflop circuit will be described with reference to FIG. 2.

When the non-inverted clock C is at a logical high level and the inverted clock $\overline{C}$ is at a logical low level, the transistors Q41 and Q42 output the amplified clock CA of the logical high level and the amplified clock $\overline{CA}$ of the logical low level, respectively, so that the transistors Q43 and Q44 are turned on, and the transistors Q45 and Q46 are off. Thus, the transistor Q43 supplies a current of the constant current source IS13, so that the transistors Q11 and Q12 are put in an off condition. On the other hand since the transistor Q45 is off, the transistors Q13 and Q14 are put in an on condition so as to supply a current of the constant current source IS12. Thus, the master LH circuit 1A becomes a holding condition. Furthermore, since the transistor Q44 supplies a current of the constant current source IS22, so as to put the transistors Q23 and Q24 in an off condition, and on the other hand, since the transistor Q46 is off, the transistors Q21 and Q22 are put in an on condition so as to supply a current of the constant current source IS23. Thus, the slave LH circuit 2A assumes a latching condition.

To the contrary, when the non-inverted clock C is at the logical low level and the inverted clock $\overline{C}$ is at the logical high level, the transistors Q41 and Q42 output the amplified clock CA of the logical low level and the amplified clock $\overline{CA}$ of the logical high level, respectively, so that the transistors Q45 and Q46 are turned on, and the transistors Q43 and Q44 are off. Thus, the transistors Q11–Q14 and Q21–Q34 respectively assume conditions opposite to the conditions when the non-inverted clock C was at the logical high level and the inverted clock $\overline{C}$ was at the logical low level. As a result, the master LH circuit 1A assumes the latching condition, and the slave LH circuit 2A assumes the holding condition. Thus, the shown circuit performs a flipflop operation.

In the second prior art flipflop circuit, since the size of the clock driving transistors Q43–Q46 is made sufficiently larger than that of the data processing transistors Q11–Q41 and Q21–Q24, and since the resistors R13 and R23 are added between the power supply voltage VCC and the common-connected nodes of the load resistors R11 and R12 and between the power supply voltage VCC and the common-connected nodes of the load resistors R21 and R22, respectively, a compelling force is added to the driving capability of the transistors Q43–Q46 against the transistors Q11–Q41 and Q21–Q24.

However, the second prior art flipflop circuit requires the amplifying circuit at an input stage of the clock driving circuit which operates at the highest frequency. This is disadvantageous to a high speed operation.

Furthermore, in order to add the compelling force to the clock driving, the clock driving transistors are required to have a large size. This is a cause of enlarging the device scale.

SUMMARY OF THE INVENTION

Accordingly, it is an object of the present invention to provide a flipflop circuit which has overcome the above mentioned defects of the conventional ones.

Another object of the present invention is to provide a flipflop circuit capable of operating with a low voltage of not greater than 2 V.

Still another object of the present invention is to provide a flipflop circuit capable of operating with a low voltage of not greater than 2 V without requiring the amplifying circuit at the input stage of the clock driving circuit which operates at the highest frequency.

A further object of the present invention is to provide a flipflop circuit capable of operating with a low voltage of not greater than 2 V without the necessity of enlarging the device scale.

The above and other objects of the present invention are achieved in accordance with the present invention by a flipflop circuit comprising:

a master latch-hold circuit latching and holding a pair of complementary input data signals in synchronism with a pair of complementary clocks for outputting a pair of complementary master data signals, the master latch/hold circuit including first and second transistors having their emitters connected in common and their bases connected to receive the pair of complementary input data signals, respectively, third and fourth transistors having their emitters connected in common to the emitters of the first and second transistors, and their collectors connected to a collectors of the first and second transistors, respectively, and the collector of each of the third and fourth transistors being cross-connected to a base of the other of the third and fourth transistors, a first constant current source connected between the common-connected emitters of the first, second, third and fourth transistors and a first power supply voltage, first and second resistors having their one end connected in common to a second power supply voltage and their other end connected to the common-connected collectors of the first and third transistors and the common-connected collectors of the second and fourth transistors, respectively, the common-connected collectors of the first and third transistors and the common-connected collectors of the second and fourth transistors outputting the pair of complementary master data signals;

a slave latch/hold circuit latching and holding a pair of complementary slave input data signals corresponding to the pair of complementary master data signals, in synchronism with the pair of complementary clocks, for outputting a pair of complementary output data signals, the slave latch/hold circuit including fifth and sixth transistors having their emitters connected in common and their bases connected to receive the pair of complementary slave input data signals, respectively, seventh and eighth transistors having their emitters connected in common and the common-connected emitters of the fifth and sixth transistors, and their collectors connected to a collectors of the fifth and sixth transistors, respectively, and each cross-connected to a base of the other of the seventh and eighth transistors, a second constant current source connected between the common-connected emitters of the fifth, sixth, seventh and eighth transistors and the first power supply voltage, third and fourth resistors having their one end connected in common to the second power supply voltage and their other end connected to the common-connected collectors of the fifth and seventh transistors and the common-connected collectors of the sixth and eighth transistors, respectively, the common-connected collectors of the fifth and seventh transistors and the common-connected collectors of the sixth and eighth transistors outputting the pair of complementary output data signals; and a clock driving circuit receiving at least one of the pair of complementary clocks for driving the first and slave latch/hold circuits to cause the first and slave latch/hold circuits to operate in synchronism with each other, the clock driving circuit having a pull-down circuit for lowering respective potential levels of the pair of complementary input data signals and the pair of complementary master data signals, in response to the pair of complementary clocks.

For example, the pull-down circuit is connected to terminals of the pair of complementary input data signals, respectively, and receives the at least one of the pair of complementary clocks, to control the master latch/hold circuit in such a manner that, when the clock is not active, the pull-down circuit does not draw a current from the input terminals of the pair of complementary input data signals, so that the input terminals assume respective levels of the pair of complementary input data signals, whereby one of the first and second transistors is turned on and the other of the first and second transistors is turned off, with the result that the pair of complementary input data signals are latched in a differential pair composed of the third and fourth transistors, and when the clock is active, the pull-down circuit draws a current from the input terminals, both the input terminals are brought to a low level, whereby both of the first and second transistors are maintained off, with the result that the pair of complementary input data signals are held in the differential pair composed of the third and fourth transistors.

The above and other objects, features and advantages of the present invention will be apparent from the following description of preferred embodiments of the invention with reference to the accompanying drawings.

DESCRIPTION OF THE PREFERRED EMBODIMENTS

Figure 1:
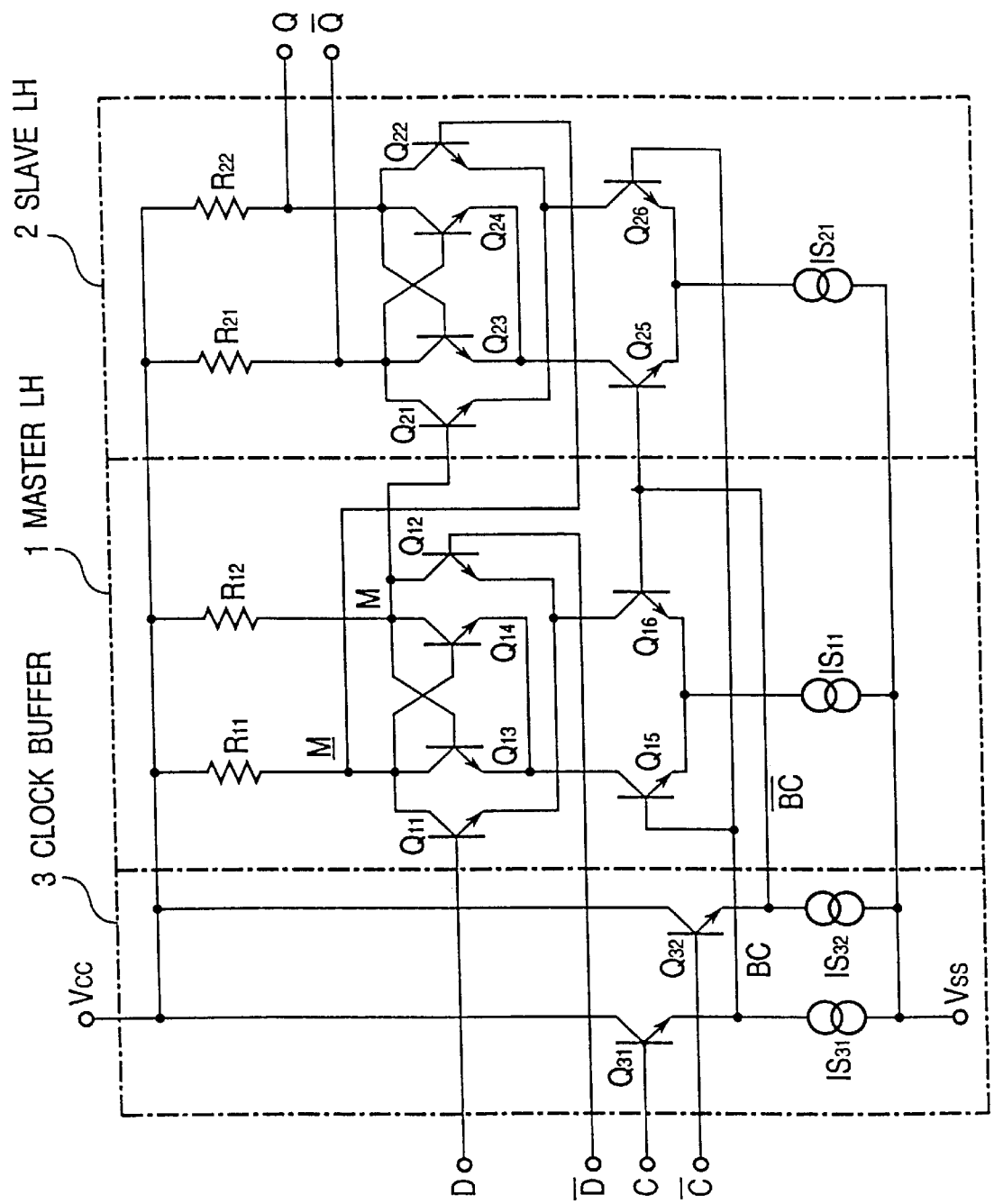
FIG. 1 is a circuit diagram of a first prior art flipflop circuit.
Figure 2:
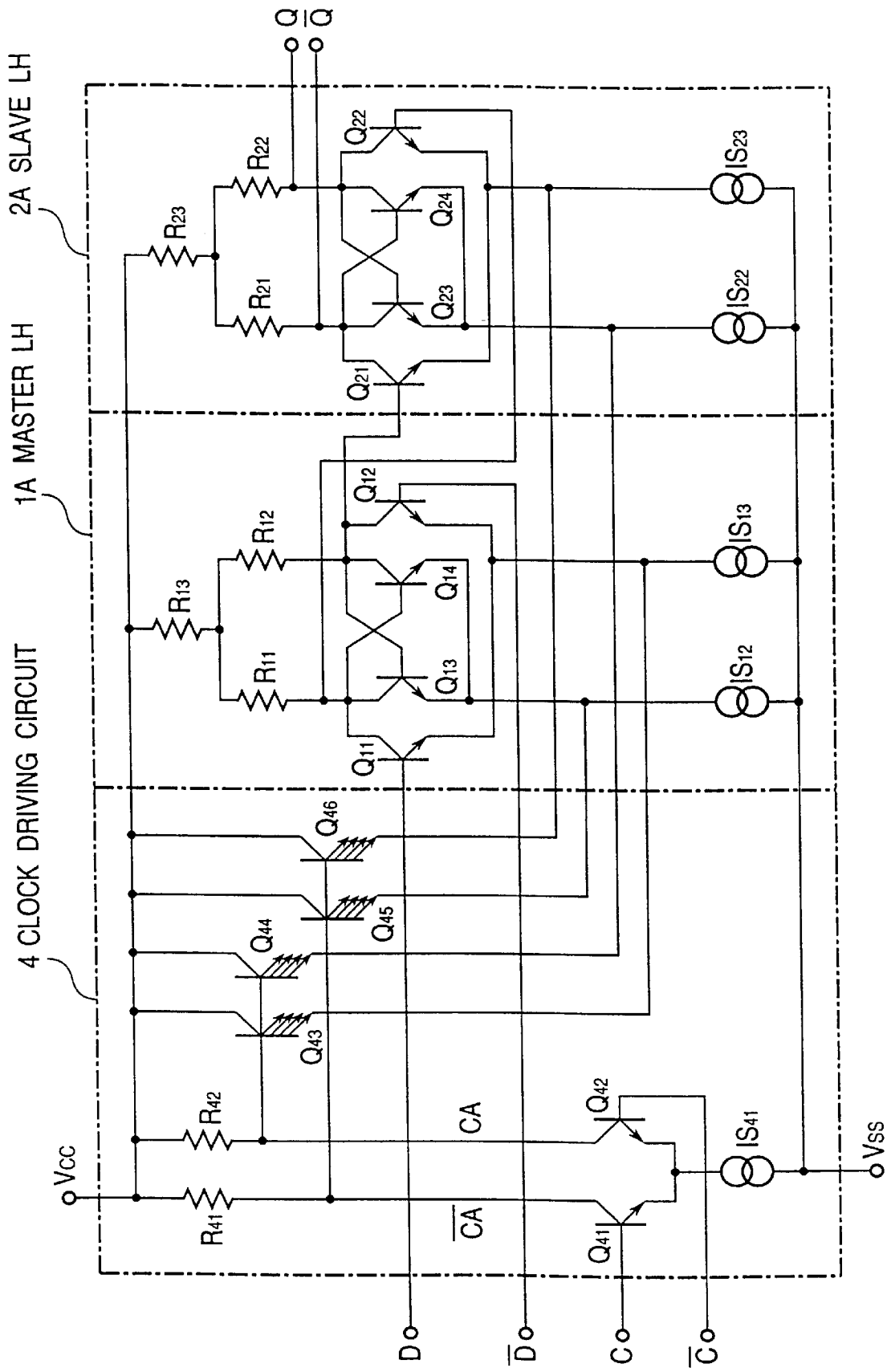
FIG. 2 is a circuit diagram of a second prior art flipflop circuit.
Figure 3:
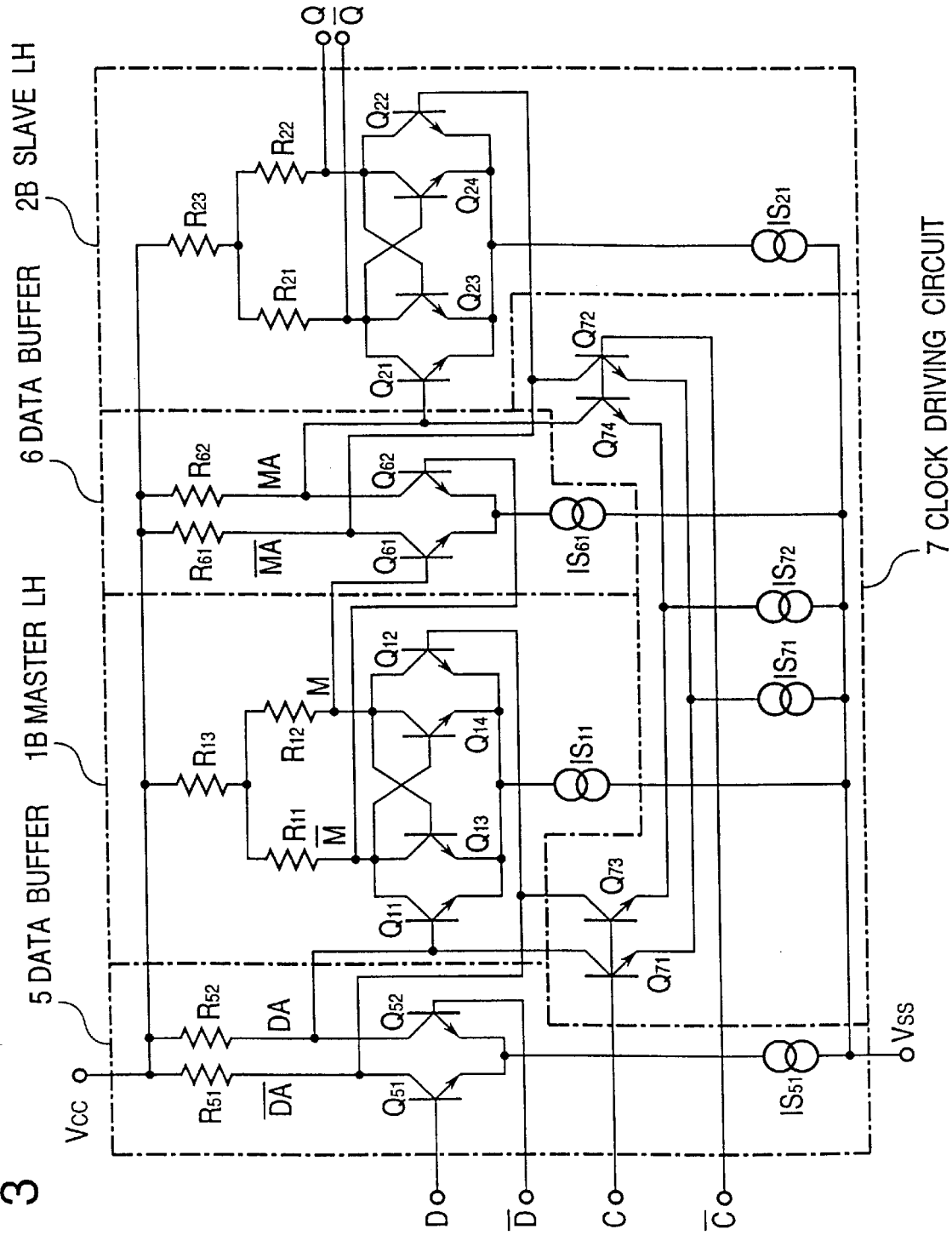
FIG. 3 is a circuit diagram of a first embodiment of the flipflop circuit in accordance with the present invention.

Referring to FIG. 3, there is shown a circuit diagram of a first embodiment of the flipflop circuit in accordance with the present invention. In FIG. 3, elements similar to those shown in FIGS. 1 and 2 are given the same Reference Numerals and Signs.

The shown first embodiment includes a master latch/hold (LH) circuit 1B latching and holding a pair of complementary amplified data signals DA and $\overline{DA}$ in synchronism with a pair of complementary clocks C and $\overline{C}$, for outputting a pair of complementary master data signals M and $\overline{M}$, a slave latch/hold (LH) circuit 2B latching and holding a pair of complementary amplified data signals MA and $\overline{MA}$ in synchronism with the pair of complementary clocks C and $\overline{C}$, for outputting a pair of complementary output data signals Q and $\overline{Q}$, a data buffer 5 receiving and amplifying a pair of complementary data signals D and $\overline{D}$, for outputting the pair of complementary amplified data signals DA and $\overline{DA}$ to the master LH circuit 1B, another data buffer 6 receiving and amplifying the pair of complementary master data signals M and $\overline{M}$, for outputting the pair of complementary amplified master data signals MA and $\overline{MA}$ to the slave LH circuit 2B, and a clock driving circuit 7 receiving a pair of complementary clocks C and $\overline{C}$, for outputting the pair of complementary buffered clocks BC and $\overline{BC}$ to the master LH circuit 1B and the slave LH circuit 2B.

The master LH circuit 1B includes a pair of bipolar transistors Q11 and Q12 having their emitters connected in common and their bases connected to receive the amplified data signals DA and $\overline{DA}$, respectively, another pair of bipolar transistors Q13 and Q14 having their emitters connected in common to the emitters of the transistors Q11 and Q12. Collectors of the transistors Q13 and Q14 are connected to collectors of the transistors Q11 and Q12, respectively, and the collector of each of the transistors Q11 and Q14 is cross-connected to a base of the other of transistors Q13 and Q14. The master LH circuit 1B also includes a constant current source IS11 connected between the common-connected emitters of the transistors Q11 to Q14 and a power supply voltage VSS, a pair of resistors R11 and R12 having their one end connected in common and their other end connected to the common-connected collectors of the transistors Q11 and Q13 for outputting the inverted master data signals $\overline{M}$, and the common-connected collectors of the transistors Q12 and Q14 for outputting the non-inverted master data signals M, respectively, and a third resistor R13 connected between a power supply voltage VCC and the common-connected ends of the pair of resistors R11 and R12.

Furthermore, the slave LH circuit 2B includes a pair of bipolar transistors Q21 and Q22 having their emitters connected in common and their bases connected to receive the amplified master data signals MA and $\overline{MA}$, respectively, another pair of bipolar transistors Q23 and Q24 having their emitters connected in common with the common-connected emitters of the transistors Q21 and Q22. Collectors of the transistors Q23 and Q24 are connected to collectors of the transistors Q21 and Q22, respectively, and the collector of each of the transistors Q23 and Q24 is cross-connected to a base of the other of the transistors Q23 and Q24. The slave LH circuit 2B also includes a constant current source IS21 connected between the common-connected emitters of the transistors Q21 to Q24 and a power supply voltage VSS, a pair of resistors R21 and R22 having their one end connected in common and their other end connected to the common connected collectors of the transistors Q21 and Q23 for outputting the inverted output data signals $\overline{D}$, and the common-connected collectors of the transistors Q22 and Q24 for outputting the non-inverted output data signals D, respectively, and a third resistor R23 connected between the power supply voltage VCC and the common-connected ends of the pair of resistors R21 and R22.

The data buffer 5 includes a pair of bipolar transistors Q51 and Q52 having their emitters connected in common and their bases connected to receive the data signals D and $\overline{D}$, respectively, and their collectors for outputting the amplified data signals $\overline{DA}$ and DA, respectively, a pair of resistors R51 and R52 connected between the collector of the transistor Q51 and the power supply voltage VCC and between the collector of the transistor Q52 and the power supply voltage VCC, respectively, and a constant current source IS51 connected between the common-connected emitters of the transistors Q51 and Q52 and the power supply source VSS.

The data buffer 6 includes a pair of bipolar transistors Q61 and Q62 having their emitters connected in common and their bases connected to receive the master data signals M and $\overline{M}$, respectively, and their collectors for outputting the amplified master data signals $\overline{MA}$ and MA, respectively, a pair of resistors R61 and R62 connected between the collector of the transistor Q61 and the power supply voltage VCC and between the collector of the transistor Q62 and the power supply voltage VCC, respectively, and a constant current source IS61 connected between the common-connected emitters of the transistors Q61 and Q62 and the power supply source VSS.

The clock driving circuit 7 includes a pair of bipolar transistors Q71 and Q72 having their emitters connected in common and their bases connected to receive the clock C and $\overline{C}$, respectively, and their collectors connected to the collectors of the transistors Q52 and Q61, respectively (namely, to the base of the transistors Q11 and Q22, respectively), another pair of bipolar transistors Q73 and Q74 having their emitters connected in common and their bases connected to receive the clock C and $\overline{C}$, respectively, and their collectors connected to the collectors of the transistors Q54 and Q62, respectively (namely, to the base of the transistors Q12 and Q21, respectively), a constant current source IS71 connected between the common-connected emitters of the transistors Q71 and Q72 and the power supply voltage VSS, and another constant current source IS72 connected between the common-connected emitters of the transistors Q73 and Q74 and the power supply voltage VSS.

Now, operation of the first embodiment will be described with reference to FIG. 3.

The pair of input data signals D and $\overline{D}$ are amplified by the transistors Q51 and Q52 of the data buffer 5, so that the data buffer 5 outputs the pair of amplified data signals DA and $\overline{DA}$. When the non-inverted clock C is at a logical low level and the inverted clock $\overline{C}$ is at a logical high level, the transistors Q72 and Q74 are rendered on, and the transistors Q71 and Q73 are off. Accordingly, the respective collector potentials of the transistors Q51 and Q52, namely, the potentials of the amplified amplified data signals DA and $\overline{DA}$ become, equivalent to the case in which the transistors Q71 and Q73 are not provided. Therefore, each of the transistors Q11 and Q12 is turned on or off in accordance with whether the respective potentials of the amplified amplified data signals DA and $\overline{DA}$ are at the high level or at the low level, so that the data signals is latched. Here, the resistor R13 inserted between the power supply voltage VCC and the resistors R11 and R12, is provided for the purpose of surely latching the data signals, by making the potential of the high level of the master data signals M and $\overline{M}$ outputted from the master LH circuit 1B lower than the amplified data signals DA and $\overline{DA}$.

The data buffer 6 amplifies the master data signals M and $\overline{M}$ and outputs the amplified master data signals MA and $\overline{MA}$. As mentioned above, however since the transistors Q72 and Q74 are in an on condition, the collectors of the transistors Q61 and Q62, namely, the amplified master data signals MA and $\overline{MA}$, are pulled down to the low level. Accordingly, in the slave LH circuit 2B, the transistors Q21 and Q22 are off, so that the slave LH circuit 2B is in a holding condition. As a result, the data of the transistors Q23 and Q24 in the holding condition is outputted as the output data signals Q and $\overline{Q}$.

To the contrary, when the non-inverted clock C is at the logical high level and the inverted clock $\overline{C}$ is at the logical low level, the transistors Q71 and Q73 are on and the transistors Q72 and Q74 are off. As a result, the amplified data signals DA and $\overline{DA}$ are pulled down to the low level, so that the transistors Q11 and Q12 are in an off condition. Namely, the master LH circuit 1B is in the holding condition. On the other hand, the data buffer 6 outputs the amplified master data signals $\overline{MA}$ and MA corresponding to the master data signals M and $\overline{M}$ of the master LH circuit 1B in the holding condition. Since the transistors Q72 and Q74 are off, each of the transistors Q21 and Q22 is turned on or off in accordance with the level of the amplified master data signals $\overline{MA}$ and MA, so that the slave LH circuit 2B latches the data.

As mentioned above, the flipflop circuit of the first embodiment performs an operation of a master-slave flipflop.

The flipflop circuit of the first embodiment can operate with a low voltage of not greater than 1 V, since all circuit elements are so connected that only one base-emitter voltage of one transistor (requiring an operation voltage) exists in series between the power supply voltages VCC and VSS.

Figure 4:
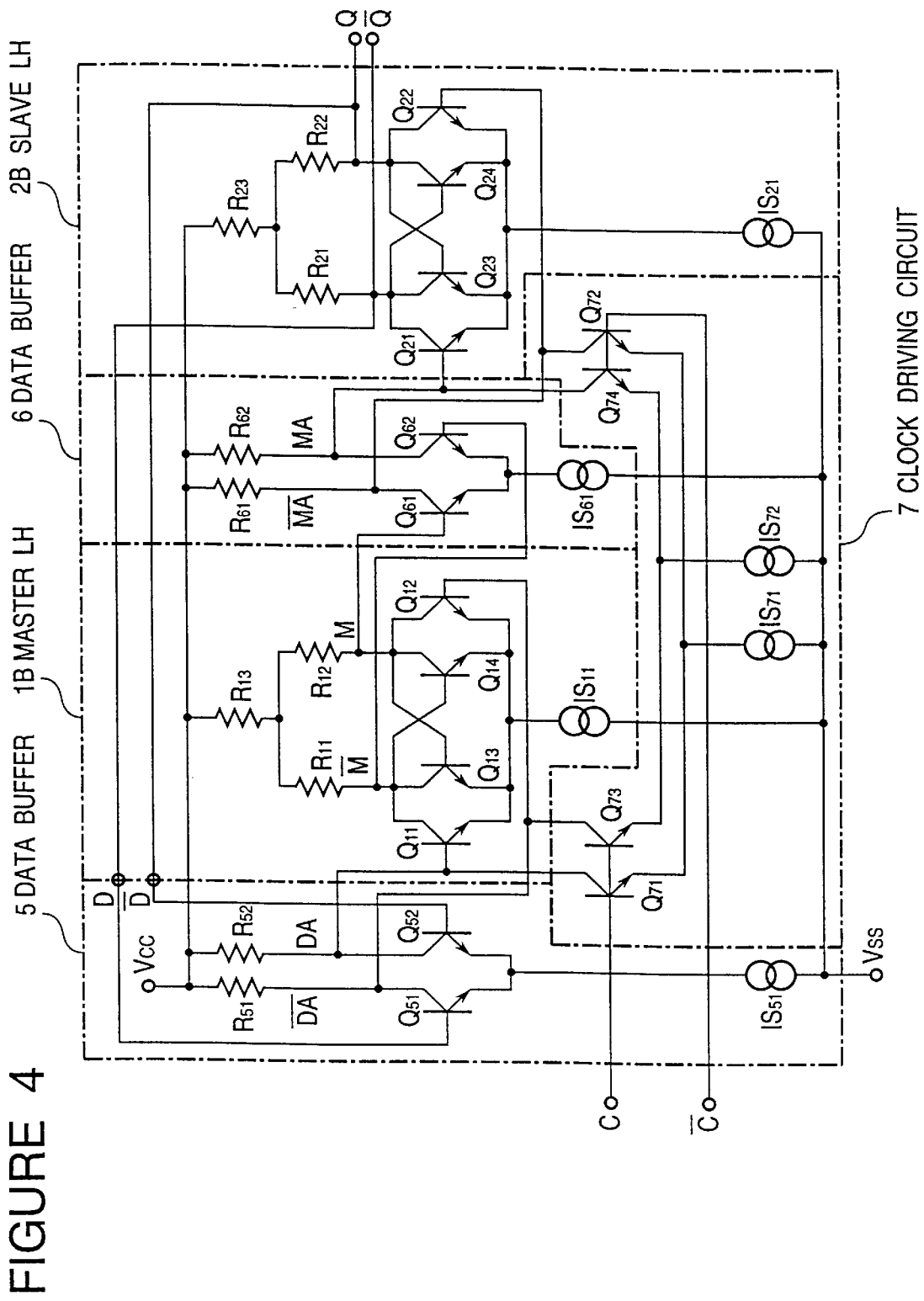
FIG. 4 is a circuit diagram of a second embodiment of the flipflop circuit in accordance with the present invention.

Referring to FIG. 4, there is shown a circuit diagram of a second embodiment of the flipflop circuit in accordance with the present invention. In FIG. 4, elements similar to those shown in FIG. 3 are given the same Reference Numerals and Signs, and explanation thereof will be omitted for simplification of description.

As seen from a comparison between FIG. 3 and 4, the second embodiment is different from the first embodiment only in that the data buffer 5 is connected to receive the feedback output data signals $\overline{Q}$ and Q as the input data signals D and $\overline{D}$, for generating the amplified feedback data signals DA and $\overline{DA}$ to the master LH circuit 1B. Thus, as a whole, the second embodiment operates as a master-slave T-type flipflop for outputting the output data signals Q and $\overline{Q}$ having a frequency which is half of the frequency of the clock C and $\overline{C}$.

Figure 5A:
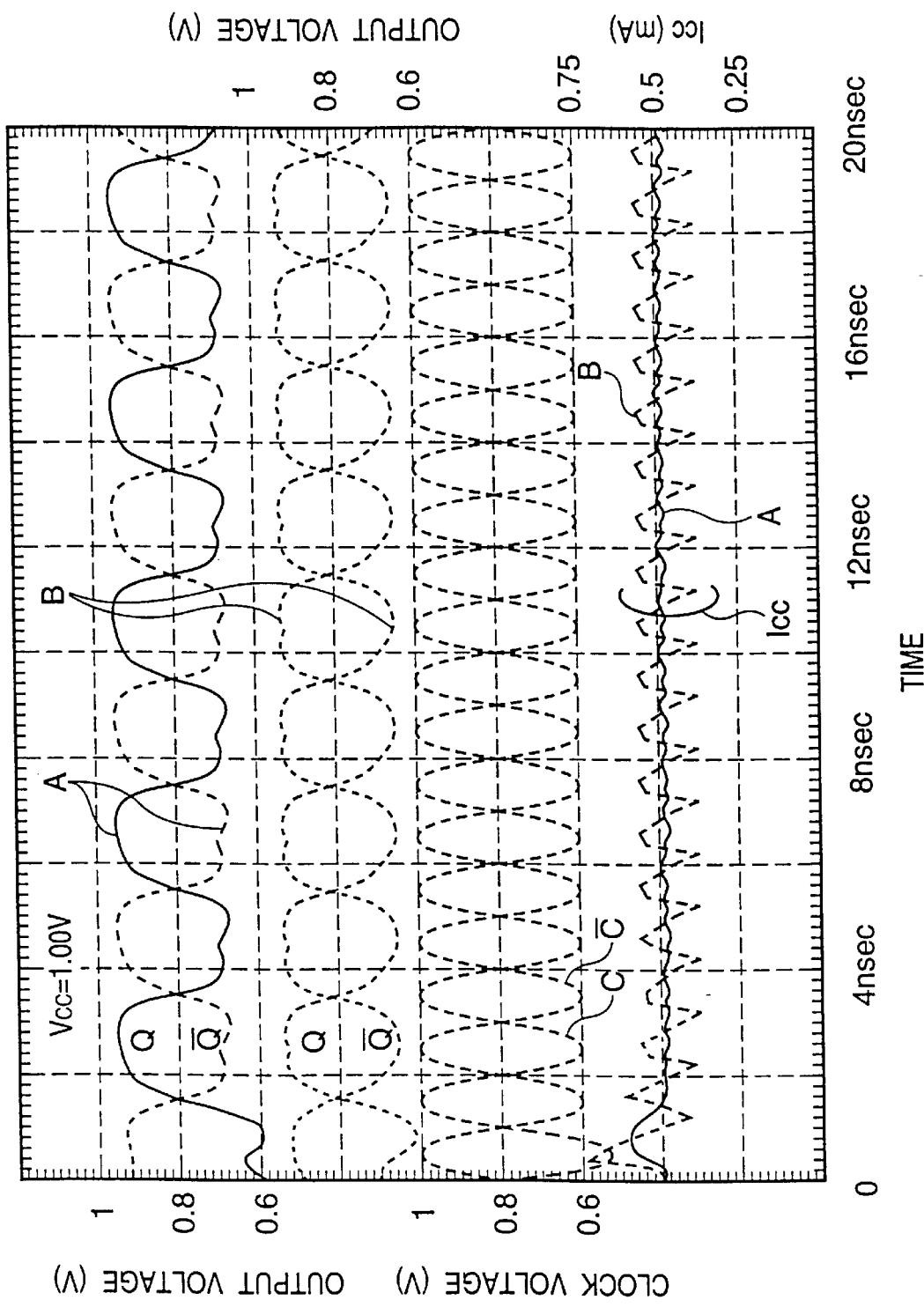
FIG. 5A, 5B and 5C are waveform diagrams illustrating an operation of the flipflop circuit in accordance with the present invention, in comparison with that of the second prior art flipflop circuit.

Now, operation of the second embodiment will be described with reference to FIG. 4 and FIG. 5A illustrating an operation waveform of the second embodiment.

When the clock C is at a logical high level, the slave LH circuit 2B latches the outputs of the data buffer 6, namely, the amplified master data signals MA and $\overline{MA}$, similarly to the first embodiment, so that the output data signals Q and $\overline{Q}$ are flipped. Then, when the clock C assumes the logical low level, the slave LH circuit 2B holds the output data signals Q and $\overline{Q}$, as shown by curved lines A in FIG. 5A. FIG. 5A illustrates an operation example in which the power supply voltage VCC was 1 V the frequency of the clock C was 500 MHz, and a consumed current ICC was 0.5 mA. For comparison, FIG. 5A also shows, by curved lines B, an operation waveform of a T-type flipflop constituted by feeding back the output Q and $\overline{Q}$ as the complementary data signals $\overline{D}$ and D in the second prior art flipflop circuit. Under the operation condition in the case shown in FIG. 5A, both the second embodiment flipflop circuit and the second prior art flipflop circuit operate normally.

Figure 5B:
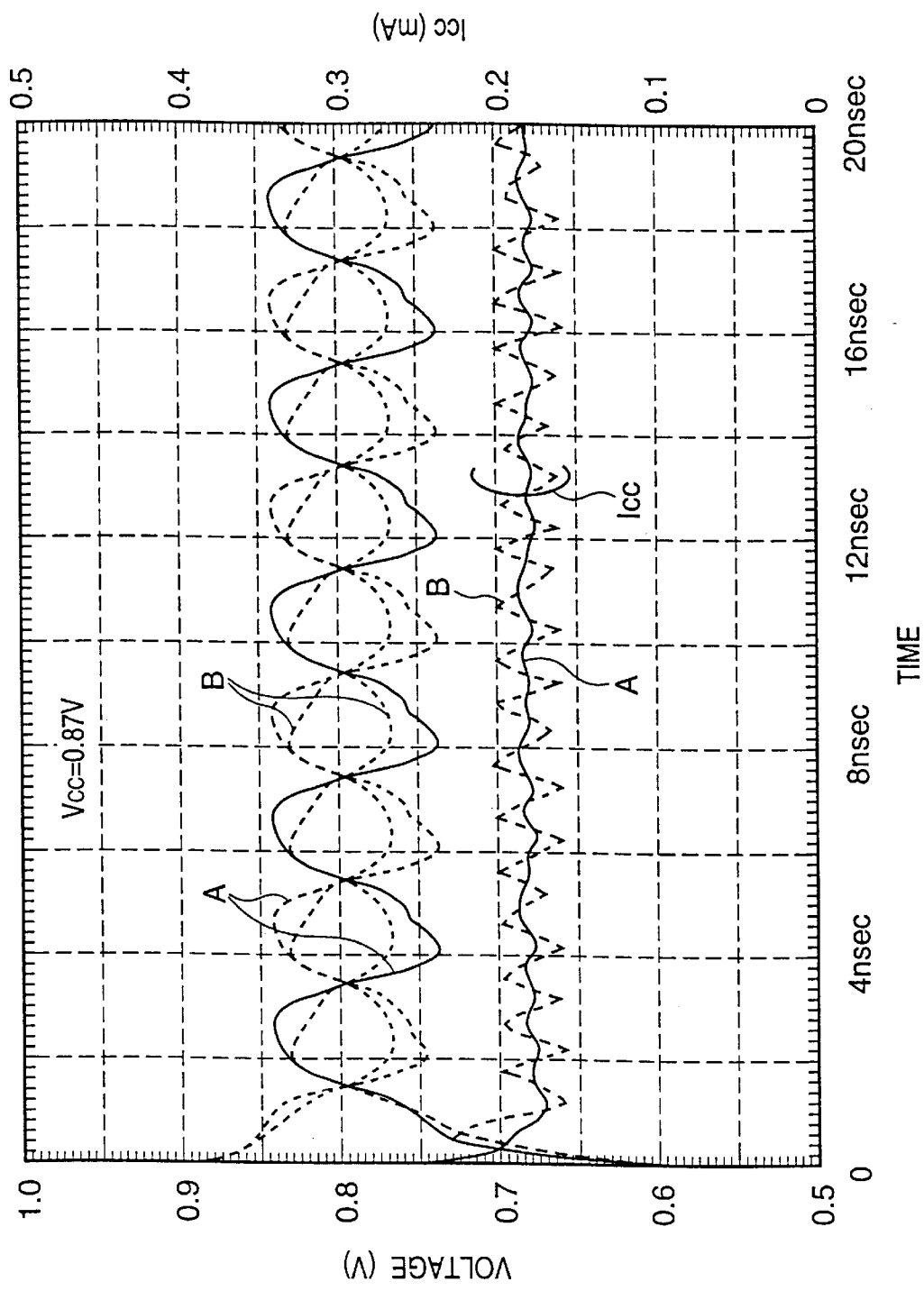

FIG. 5B illustrates an operation waveform of the second embodiment flipflop circuit and the second prior art flipflop circuit when the power supply voltage VCC was dropped to 0.87 V. Curved lines A show the second embodiment flipflop circuit, and curved lines B show the second prior art flipflop circuit. The consumed current ICC was reduced to 0.18 mA, and therefore, an output amplitude correspondingly becomes small. However, both the second embodiment flipflop circuit and the second prior art flipflop circuit operate normally. The output amplitude of the second prior art flipflop circuit is smaller than that of the second embodiment flipflop circuit. This is considered to occur because the second prior art flipflop circuit does not have nay circuit corresponding to the data buffer in the second embodiment flipflop circuit for the purpose of amplifying the data signals signal.

Figure 5C:
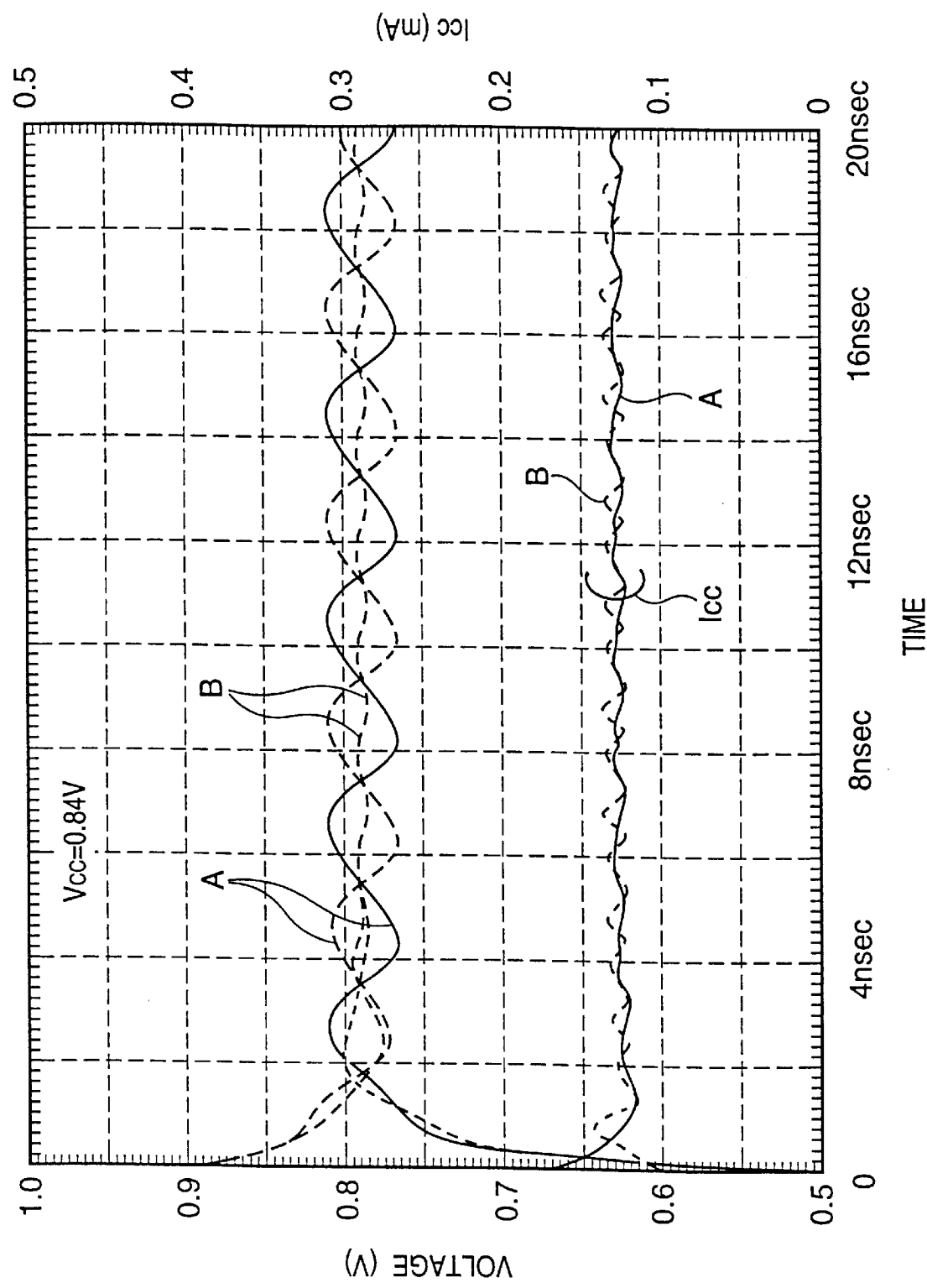

FIG. 5C illustrates an operation waveform of the second embodiment flipflop circuit and the second prior art flipflop circuit when the power supply voltage VCC was dropped to 0.84 V. Curved lines A show the second embodiment flipflop circuit, and curved lines B show the second prior art flipflop circuit. The consumed current ICC was further reduced to 0.18 mA. The second embodiment flipflop circuit operates normally, but the second prior art flipflop circuit causes faulty operation.

It should be noted that, the constant current sources used in the second embodiment flipflop circuit and the second prior art flipflop circuit are constituted of a known current mirror circuit using a reference circuit composed of a resistor and a diode connected in series between the power supply voltages VCC and VSS. Although a known bandgap reference is used, a similar low voltage characteristic is exhibited in a range of 0.87 V to 0.84 V.

Figure 6:
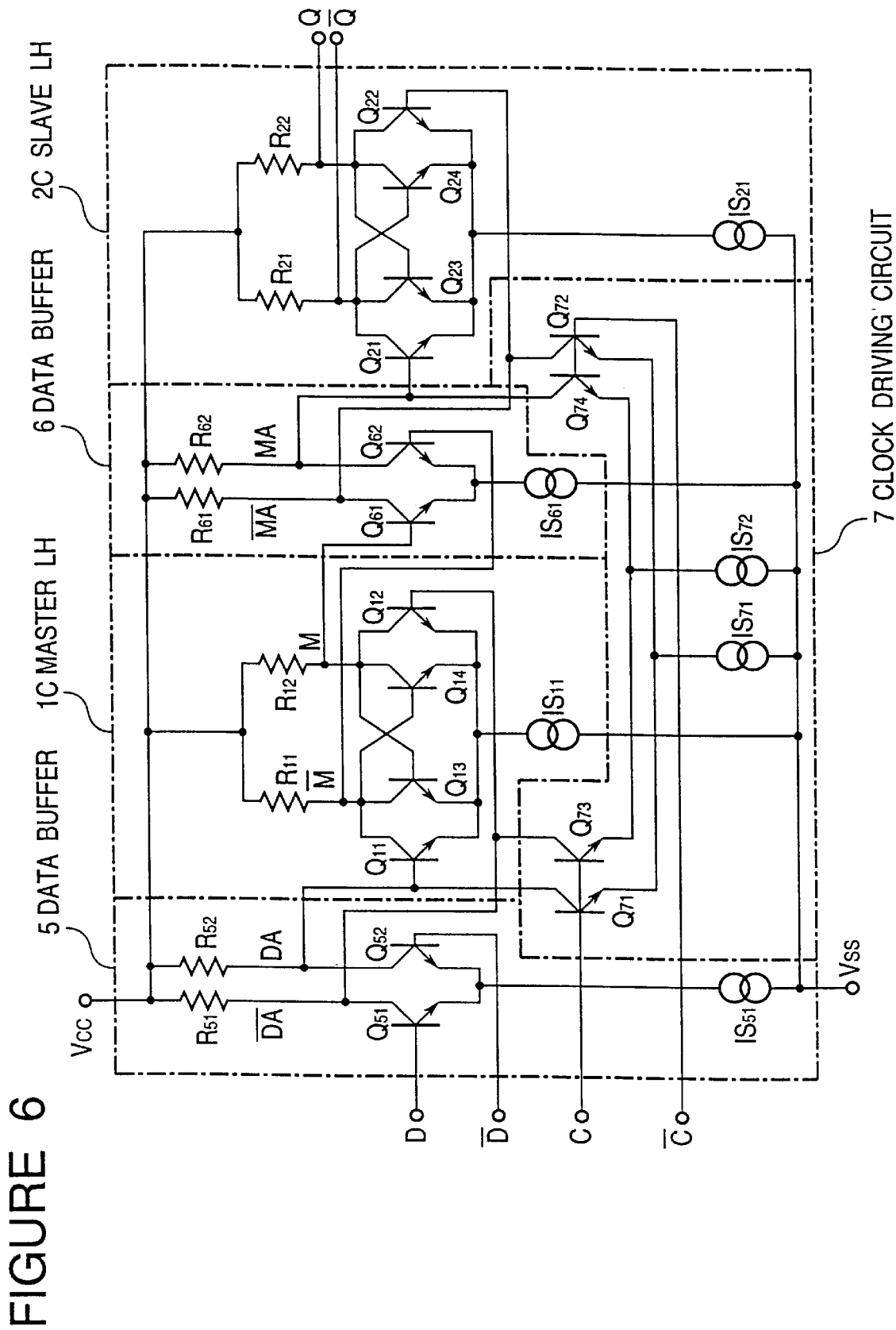
FIG. 6 is a circuit diagram of a third embodiment of the flipflop circuit in accordance with the present invention.

Referring to FIG. 6, there is shown a circuit diagram of a third embodiment of the flipflop circuit in accordance with the present invention. In FIG. 6, elements similar to those shown in FIG. 3 are given the same Reference Numerals and Signs, and explanation thereof will be omitted for simplification of description.

As seen from comparison between FIGS. 3 and 6, the third embodiment is different from the first embodiment only in that the third embodiment includes am aster LH circuit 1C and a slave LH circuit 2C which correspond to the master LH circuit 1B and a slave LH circuit 2B of the first embodiment, respectively, but in which the resistors R13 and R23 provided in the master LH circuit 1B and the slave LH circuit 2B are removed, namely, their resistance is made zero.

As mentioned hereinbefore in connection with the first embodiment, the resistors R13 and R23 are provided for a level shifting for the purpose of surely latching the data signals, by making the potential of the high level of the master data signals M and $\overline{M}$ and the output data signals Q and $\overline{Q}$, lower than the amplified data signals DA and $\overline{DA}$ and the amplified master data signals MA and $\overline{MA}$, respectively. However, the necessary amount of this level shifting is determined by the resistance of the resistors R13 and R23 and the value of the constant current sources IS11 and IS21. In the master LH circuit 1C, however, since the differential pair composed of the transistors Q11 and Q12 and the differential pair composed of the transistors Q13 and Q14 constitute a positive feedback circuit, it is possible to latch the amplified data signals DA and $\overline{DA}$. This is also true in the slave LH circuit 2C. Therefore, the third embodiment shown in FIG. 6 can operate similarly to the first embodiment shown in FIG. 3.

Figure 7:
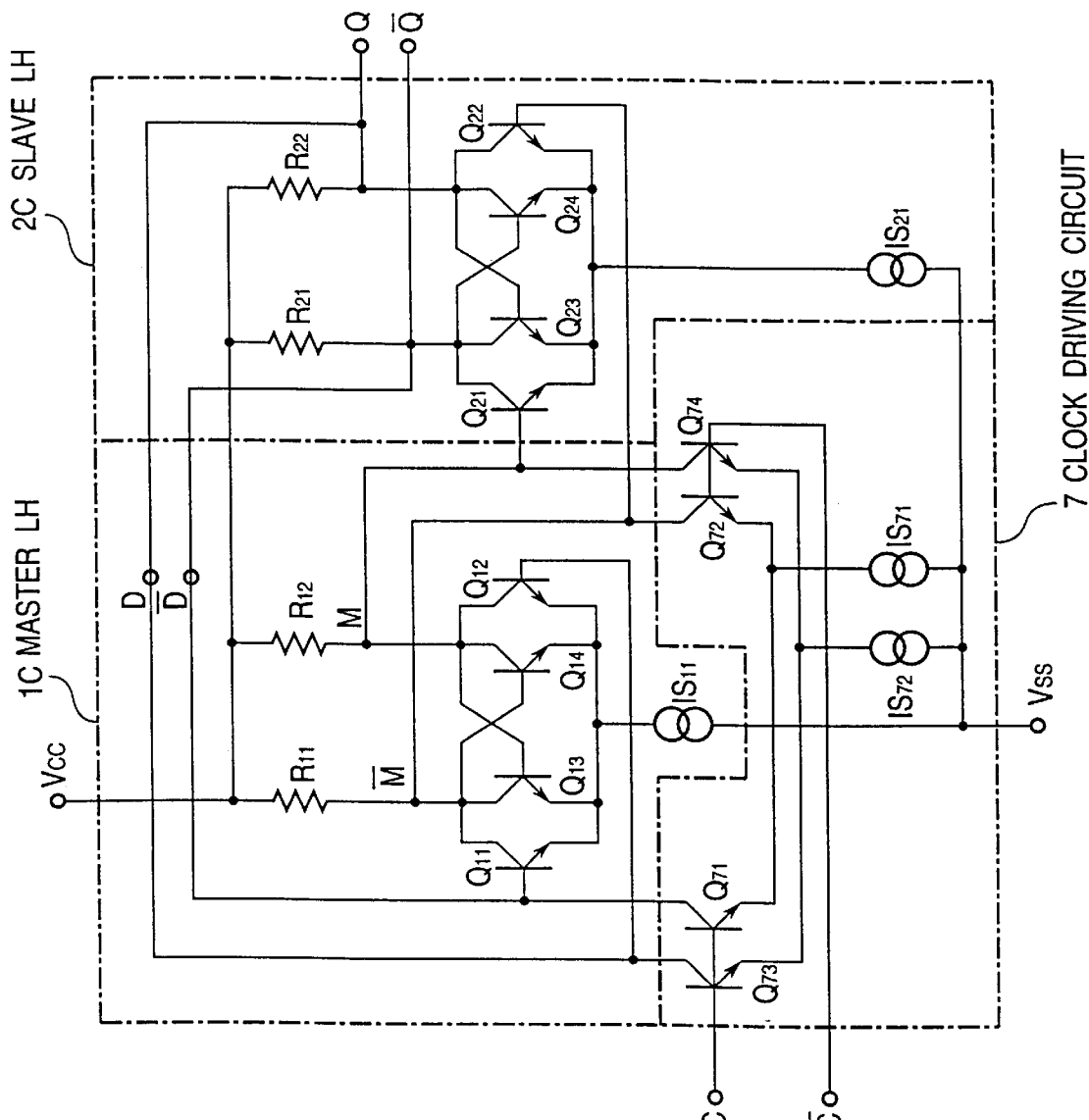
FIG. 7 is a circuit diagram of a fourth embodiment of the flipflop circuit in accordance with the present invention.

Referring to FIG. 7, there is shown a circuit diagram of a fourth embodiment of the flipflop circuit in accordance with the present invention. In FIG. 7, elements similar to those shown in FIG. 6 are given the same Reference Numerals and Signs, and explanation thereof will be omitted for simplification of description.

As seen from a comparison between FIGS. 6 and 7, the fourth embodiment is different from the third embodiment only in that the data buffers 5 and 6 provided in the third embodiment are removed and the master LH circuit 1C is connected to receive the feedback output data signals Q and $\overline{Q}$ as the input data signals D and $\overline{D}$, so that, as a whole, the fourth embodiment operates as a master-slave T-type flipflop for outputting the output data signals Q and $\overline{Q}$ having a frequency which is half of the frequency of the clock C and $\overline{C}$.

With this construction, it is possible to realize the master-slave T-type flipflop which is constituted of circuit elements of a number smaller than that of circuit elements required in the second prior art flipflop circuit and which can operate with a consumed current less than that required in the second prior art flipflop circuit.

In addition, the present invention can be applied not only to the T-type flipflop of the fourth embodiment but to other circuits also including a circuit composed of a plurality of cascaded D-type flipflops.

Figure 8:
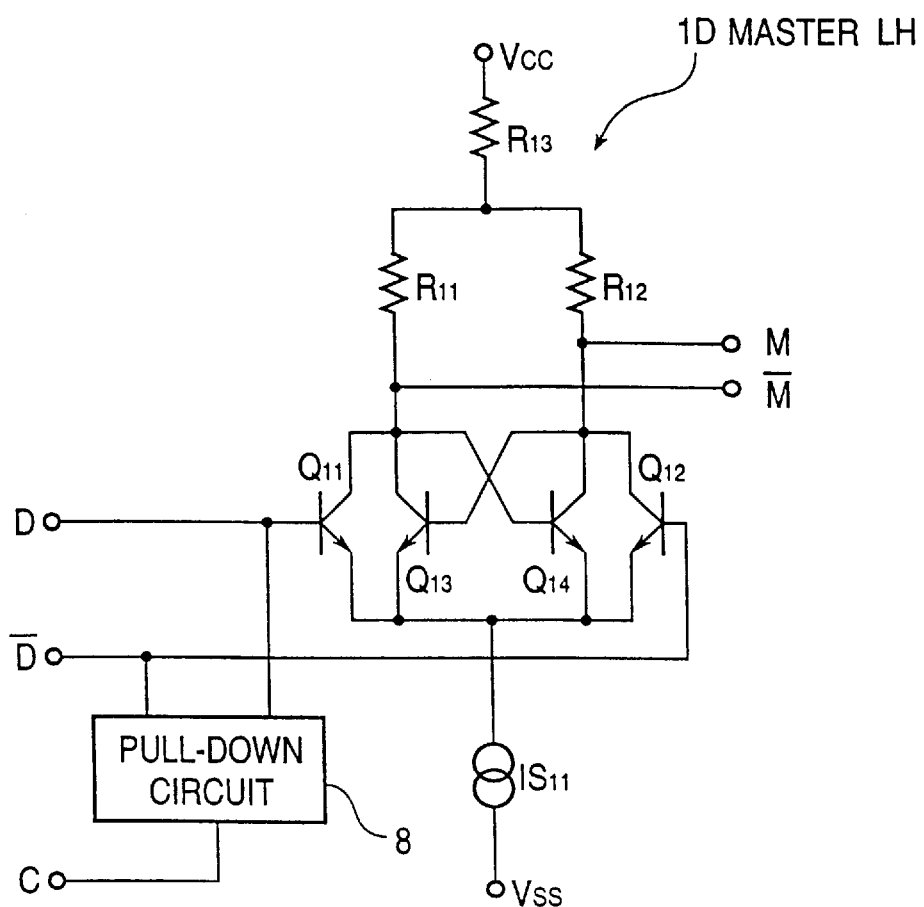
FIG. 8 is a circuit diagram of a fifth embodiment of the flipflop circuit in accordance with the present invention.

Referring to FIG. 8, there is shown a circuit diagram of a fifth embodiment of the present invention, which is directed to only a latch/hold (LH circuit 1D. In FIG. 8, elements similar to those shown in FIG. 3 are given the same Reference Numerals and Signs, and explanation thereof will be omitted for simplification of description.

As seen from comparison between FIGS. 3 and 8, the LH circuit 1D is different from the master LH circuit 1B of the first embodiment only in that the LH circuit 1D additionally includes a pull-down circuit 8 for pulling down the level of the data signals D and $\overline{D}$ to the low level in response to the clock C.

This pull-down circuit 8 is configured to realize a pull-down operation by drawing a current out of the input terminals of the data signals D and $\overline{D}$ in response to the clock C. When the clock C is not active, namely, when the pull-down circuit 8 does not draw the current from the input terminals of the data signals D and $\overline{D}$, the input terminals of the data signals D and $\overline{D}$ assume a pair of complementary data signals D and $\overline{D}$, so that one of the transistors Q11 and Q12 is turned on and the other of the transistors Q11 and Q12 is turned off, with the result that the data signals D and $\overline{D}$ are latched in the differential pair composed of the transistors Q13 and Q14, and the differential pair outputs the output data signals M and $\overline{M}$ to a next stage. To the contrary, when the clock C is active, namely, when the pull-down circuit 8 draws the current from the input terminals of the data signals D and $\overline{D}$, both the input terminals of the data signals D and $\overline{D}$ are brought to the low level, so that both the transistors Q11 and Q12 are maintained off, with the result that the data signals D and $\overline{D}$ are held in the differential pair composed of the transistors Q13 and Q14, and the differential pair outputs the held output data signals M and $\overline{M}$ to a next stage.

In this fifth embodiment, the resistor R13 can be omitted, similarly to the master LH circuit 1C in the third embodiment. In this modification, a similar operation can be obtained.

As mentioned above, the flipflop circuit in accordance with the present invention is characterized in that each latch/hold circuit is constituted of one stage of differential pair so configured that the number of transistors connected in series between first and second power supply voltages (VCC and VSS) is only one, and a clock drive circuit has a pull-down function responding to a pair of complementary clocks so as to pull down the level of a pair of complementary data signals supplied to the latch/hold circuit. With this feature, the flipflop circuit in accordance with the present invention can stably operate with a low voltage of not greater than 1 V. Of course, the flipflop circuit in accordance with the present invention is capable of operating with a low voltage of not greater than 2 V, without requiring the amplifying circuit at the input stage of the clock driving circuit which operates at the highest frequency, and without the necessity of enlarging the device scale.

The invention has thus been shown and described with reference to the specific embodiments. However, it should be noted that the present invention is in no way limited to the details of the illustrated structures, and that changes and modifications may be made within the scope of the appended claims.

We claim:

1. A flipflop circuit comprising:

a master latch/hold circuit latching and holding a pair of complementary input data signals in synchronism with a pair of complementary clocks for outputting a pair of complementary master data signals, said master latch/hold circuit including:

first and second transistors having their emitters connected together and the base of the first transistor connected to receive one of said pair of complementary input data signals and the base of the second transistor connected to receive the other of said pair of complementary input data signals, third and fourth transistors having their emitters connected together and connected in common with said emitters of said first and second transistors, the collector of said third transistor being connected to the collector of said first transistor and the collector of said fourth transistor being connected to the collector of said second transistor, and the collector of said third transistor being directly connected to the base of said fourth transistor and the collector of said fourth transistor being directly connected to the base of said third transistor, a first constant current source connected between the common-connected emitters of said first, second, third and fourth transistors and a first power supply voltage, first and second resistors, each having one of its two ends connected in common to a second power supply voltage, the other end of the first resistor being connected to the common-connected collectors of said first and third transistors, and the other end of the second resistor being connected to the common-connected collectors of said second and fourth transistors, wherein the common-connected collectors of said first and third transistors and the common-connected collectors of said second and fourth transistors output said pair of complementary master data signals;

a slave latch/hold circuit latching and holding a pair of complementary slave input data signals corresponding to said pair of complementary master data signals, in synchronism with said pair of complementary clocks, for outputting a pair of complementary output data signals, said slave latch/hold circuit including:

fifth and sixth transistors having their emitters connected together and the base of said fifth transistor being connected to receive on of said pair of complementary slave input data signals and the base of the sixth transistor being connected to receive the other of said pair of complementary slave input data signals, seventh and eighth transistors having their emitters connected together and in common with the common-connected emitters of said fifth and sixth transistors, the collector of said seventh transistor being connected to the collector of said fifth transistor, the collector of said eighth transistor being connected to the collector of said sixth transistor, the collector of said seventh transistor being directly connected to the base of said eighth transistor, and the collector of said eighth transistor being directly connected to the base of said seventh transistor, a second constant current source connected between the common-connected emitters of said fifth, sixth, seventh and eighth transistors and said first power supply voltage, third and fourth resistors, each having one of its two ends connected in common to said second power supply voltage, the other end of the third resistor being connected to the common-connected collectors of said fifth and seventh transistors, and the other end of the fourth resistor being connected to the common-connected collectors of said sixth and eighth transistors, wherein the common-connected collectors of said fifth and seventh transistors and the common-connected collectors of said sixth and eighth transistors output said pair of complementary output data signals; and a clock driving circuit receiving at least one of said pair of complementary clocks for driving said master latch/hold and slave latch/hold circuits to cause said master latch/hold and slave latch/hold circuits to operate in synchronism with each other, said clock driving circuit having a pull-down circuit for lowering respective potential levels of said pair of complementary input data signals and said pair of complementary master data signals, in response to said pair of complementary clocks.

2. A flipflop circuit according to claim 1 wherein said master latch/hold circuit further includes a fifth resistor connected between said second power supply voltage and the common-connected one ends of said first and second resistor, and said slave latch/hold circuit further includes a sixth resistor connected between said second power supply voltage and the common-connected one ends of said third and fourth resistors.

3. A flipflop circuit according to claim 1 wherein said clock driving circuit includes;

ninth and tenth transistors having their emitters connected in common and their bases connected to receive said pair of complementary clocks, respectively, and their collectors connected to said bases of said first and sixth transistors, respectively;

eleventh and twelfth transistors having their emitters connected in common and their bases connected to receive said pair of complementary clocks, respectively, and their collectors connected to said bases of said second and fifth transistors, respectively;

a third constant current source connected between the common-connected emitters of said ninth and tenth transistors and said first power supply voltage; and a fourth constant current source connected between the common-connected emitters of said eleventh and twelfth transistors and said first power supply voltage.

4. A flipflop circuit according to claim 1 further including:

a first data buffer receiving and amplifying a pair of complementary supplied data signals for outputting said pair of complementary input data signals to said master latch/hold circuit; and a second data buffer receiving and amplifying said pair of complementary master data signals for outputting said pair of complementary slave input data signals to said slave latch/hold circuit.

5. A flipflop circuit according to claim 4, wherein said first data buffer includes thirteenth and fourteenth transistors having their emitters connected in common and their bases connected to receive said pair of complementary supplied data signals, respectively, and their collectors for outputting said pair of complementary input data signals, respectively, seventh and eighth resistors connected between said collectors of said thirteenth and fourteenth transistors and said second power supply voltage, respectively, and a fifth constant current source connected between the common-connected emitters of said thirteenth and fourteenth transistors and said first power supply voltage, and wherein said second data buffer includes: fifteenth and sixteenth transistors having their emitters connected in common and their bases connected to receive said pair of complementary master data signals, respectively, and their collectors for outputting said pair of complementary slave input data signals, respectively, ninth and tenth resistors connected between the collectors of said fifteenth and sixteenth transistors and said second power supply voltage, respectively, and a sixth constant current source connected between the common-connected emitters of said fifteenth and sixteenth transistors and said first power supply voltage.

6. A flipflop circuit comprising:

a master latch/hold circuit latching and holding a pair of complementary input data signals in synchronism with a pair of complementary clocks for outputting a pair of complementary master data signals, said master latch/hold circuit including:

first and second transistors having their emitters connected in common, and the base of said first transistor being connected to receive one of said pair of complementary input data signals, and the base of said second transistor being connected to receive the other of said pair of complementary input data signals, third and fourth transistors having their emitters connected together in common with said emitters of said first and second transistors, the collector of said third transistor being connected to the collector of said first transistor, and the collector of said fourth transistor being connected to the collector of said second transistor, and the collector of said third transistor being connected to the base of said fourth transistor, and the collector of said fourth transistor being connected to the base of said third transistor, a first constant current source connected between the common-connected emitters of said first, second, third and fourth transistors and a first power supply voltage, and first and second resistors, each having one of its two ends connected in common to a second power supply voltage, the other end of said first resistor being connected to the common-connected collectors of said first and third transistors, and the other end of said second resistor being connected to the common-connected collectors of said second and fourth transistors, wherein the common-connected collectors of said first and third transistors and the common-connected collectors of said second and fourth transistors output said pair of complementary master data signals;

a slave latch/hold circuit latching and holding a pair of complementary slave input data signals corresponding to said pair of complementary master data signals, in synchronism to said pair of complementary clocks, for outputting a pair of complementary output data signals, said slave latch/hold circuit including:

fifth and sixth transistors having their emitters connected in common, the base of said fifth transistor being connected to receive one of said pair of complementary slave input data signals, and the base of said sixth transistor being connected to receive the other of said pair of complementary slave input data signals, seventh and eighth transistors having their emitters connected together and in common with the common-connected emitters of said fifth and sixth transistors, the collector of said seventh transistor being connected to the collector of said fifth transistor, and the collector of the eighth transistor being connected to the collector of the sixth transistor, the collector of said seventh transistor being connected to the base of said eighth transistor, and the collector of said eighth transistor being connected to the base of said seventh transistor, a second constant current source connected between the common-connected emitters of said fifth, sixth, seventh and eighth transistors and said first power supply voltage, third and fourth resistors, each having one of its two ends connected in common to said second power supply voltage, and the other end of the third resistor being connected to the common-connected collectors of said fifth and seventh transistors, and the other end of said fourth resistor being connected to the common-connected collectors of said sixth and eighth transistors, wherein the common-connected collectors of said fifth and seventh transistors and the common-connected collectors of said sixth and eighth transistors output said pair of complementary output data signals;

a clock driving circuit receiving said pair of complementary clocks for driving said master latch/hold and slave latch/hold circuits to cause said master latch/hold and slave latch/hold circuits to operate in synchronism with each other, said clock driving circuit including:

ninth and tenth transistors having their emitters connected in common and their bases connected to receive said pair of complementary clocks, respectively, and their collectors connected to said bases of said first and sixth transistors, respectively, eleventh and twelfth transistors, having their emitters connected in common and their bases connected to receive said pair of complementary clocks, respectively, and their collectors connected to said bases of said second and fifth transistors, respectively, a third constant current source connected between the common-connected emitters of said ninth and tenth transistors and said first power supply voltage, and a fourth constant current source connected between the common-connected emitters of said eleventh and twelfth transistors and said first power supply voltage;

a first data buffer receiving and amplifying a pair of externally supplied complementary data signals for outputting said pair of complementary input data signals to said master latch/hold circuit, said data buffer including:

thirteenth and fourteenth transistors having their emitters connected in common and their bases connected to receive said pair of externally supplied complementary data signals, respectively, seventh and eighth resistors, each having one of its two ends connected to said second power supply voltage, the other end of said seventh resistor being connected to the collector of said thirteenth transistor, and the other end of said eighth resistor being connected to the collector of said fourteenth transistor, a fifth constant current source connected between the common-connected emitters of said thirteenth and fourteenth transistors and said first power supply voltage, the collector of said thirteenth transistor being connected to the base of said second transistor and the collector of said eleventh transistor, and the collector of said fourteenth transistor being connected to the base of said first transistor and the collector of said ninth transistor, so that the collectors of said thirteenth and fourteenth transistors output said pair of complementary input data signals; and a second data buffer receiving and amplifying said pair of complementary master data signals for outputting said pair of complementary slave input data signals to said slave latch/hold circuit, said second data buffer including:

fifteenth and sixteenth transistors having their emitters connected in common, the base of said fifteenth transistor being connected to the collector of said second and fourth transistors, and the base of said sixteenth transistor being connected to the collector of said first and third transistors, ninth and tenth resistors, each having one of its two ends connected to said second power supply voltage, the other end of said ninth resistor being connected to the collector of said fifteenth transistor and the other end of the tenth resistor being connected to the collector of the sixteenth transistor, a sixth constant current source connected between the common-connected emitters of said fifteenth and sixteenth transistors and said first power supply voltage, the collector of said fifteenth transistor being connected to the base of said sixth transistor and the collector of said tenth transistor, and the collector of said sixteenth transistor being connected to the base of said fifth transistor and the collector of said twelfth transistor, so that the collectors of said fifteenth and sixteenth transistors output said pair of complementary slave input data signals.

7. A flipflop circuit according to claim 6, wherein said master latch/hold circuit further includes a fifth resistor connected between said second power supply voltage and the common-connected one ends of said first and second resistors, and wherein said slave latch/hold circuit further includes a sixth resistor connected between said second power supply voltage and the common-connected one ends of said third and fourth resistors.

8. A flipflop circuit comprising:

a master latch/hold circuit latching and holding a pair of complementary input data signals in synchronism with a pair of complementary clocks for outputting a pair of complementary master data signals, said master latch/hold circuit including:

first and second transistors having their emitters connected in common, and the base of said first transistor being connected to receive one of said pair of complementary input data signals, and the base of said second transistor being connected to receive the other of said pair of complementary input data signals, third and fourth transistors having their emitters connected together in common with said emitters of said first and second transistors, the collector of said third transistor being connected to the collector of said first transistor, and the collector of said fourth transistor being connected to the collector of said second transistor, and the collector of said third transistor being connected to the base of said fourth transistor, and the collector of said fourth transistor being connected to the base of said third transistor, a first constant current source connected between the common-connected emitters of said first, second, third and fourth transistors and a first power supply voltage, and first and second resistors, each having one of its two ends connected in common to a second power supply voltage, the other end of said first resistor being connected to the common-connected collectors of said first and third transistors, and the other end of said second resistor being connected to the common-connected collectors of said second and fourth transistors, wherein the common-connected collectors of said first and third transistors and the common-connected collectors of said second and fourth transistors output said pair of complementary master data signals;

a slave latch/hold circuit latching and holding a pair of complementary slave input data signals corresponding to said pair of complementary master data signals, in synchronism to said pair of complementary clocks, for outputting a pair of complementary output data signals, said slave latch/hold circuit including:

fifth and sixth transistors having their emitters connected in common, the base of said fifth transistor being connected to receive one of said pair of complementary slave input data signals, and the base of said sixth transistor being connected to receive the other of said pair of complementary slave input data signals, seventh and eighth transistors having their emitters connected together and in common with the common-connected emitters of said fifth and sixth transistors, the collector of said seventh transistor being connected to the collector of said fifth transistor, and the collector of the eighth transistor being connected to the collector of the sixth transistor, the collector of said seventh transistor being connected to the base of said eighth transistor, and the collector of said eighth transistor being connected to the base of said seventh transistor, a second constant current source connected between the common-connected emitters of said fifth, sixth, seventh and eighth transistors and said first power supply voltage, third and fourth resistors, each having one of its two ends connected in common to said second power supply voltage, and the other end of the third resistor being connected to the common-connected collectors of said fifth and seventh transistors, and the other end of said fourth resistor being connected to the common-connected collectors of said sixth and eighth transistors, wherein the common-connected collectors of said fifth and seventh transistors and the common-connected collectors of said sixth and eighth transistors output said pair of complementary output data signals;

a clock driving circuit receiving said pair of complementary clocks for driving said master latch/hold and slave latch/hold circuits to cause said master latch/hold and slave latch/hold circuits to operate in synchronism with each other, said clock driving circuit including:

ninth and tenth transistors having their emitters connected in common and their bases connected to receive said pair of complementary clocks, respectively, and their collectors connected to said bases of said first and sixth transistors, respectively, eleventh and twelfth transistors, having their emitters connected in common and their bases connected to receive said pair of complementary clocks, respectively, and their collectors connected to said bases of said second and fifth transistors, respectively, a third constant current source connected between the common-connected emitters of said ninth and tenth transistors and said first power supply voltage, and a fourth constant current source connected between the common-connected emitters of said eleventh and twelfth transistors and said first power supply voltage.

9. A flipflop circuit according to claim 8 further including:

a first data buffer receiving and amplifying a pair of externally supplied complementary data signals for outputting said pair of complementary input data signals to said master latch/hold circuit, said data buffer including:

thirteenth and fourteenth transistors having their emitters connected in common and their bases connected to receive said pair of externally supplied complementary data signals, respectively, seventh and eighth resistors, each having one of its two ends connected to said second power supply voltage, the other end of said seventh resistor being connected to the collector of said thirteenth transistor, and the other end of said eighth resistor being connected to the collector of said fourteenth transistor, a fifth constant current source connected between the common-connected emitters of said thirteenth and fourteenth transistors and said first power supply voltage, the collector of said thirteenth transistor being connected to the base of said second transistor and the collector of said eleventh transistor, and the collector of said fourteenth transistor being connected to the base of said first transistor and the collector of said ninth transistor, so that the collectors of said thirteenth and fourteenth transistors output said pair of complementary input data signals; and a second data buffer receiving and amplifying said pair of complementary master data signals for outputting said pair of complementary slave input data signals to said slave latch/hold circuit, said second data buffer including:

fifteenth and sixteenth transistors having their emitters connected in common, the base of said fifteenth transistor being connected to the collector of said second and fourth transistors, and the base of said sixteenth transistor being connected to the collector of said first and third transistors, ninth and tenth resistors, each having one of its two ends connected to said second power supply voltage, the other end of said ninth resistor being connected to the collector of said fifteenth transistor and the other end of the tenth resistor being connected to the collector of the sixteenth transistor, a sixth constant current source connected between the common-connected emitters of said fifteenth and sixteenth transistors and said first power supply voltage, the collector of said fifteenth transistor being connected to the base of said sixth transistor and the collector of said tenth transistor, and the collector of said sixteenth transistor being connected to the base of said fifth transistor and the collector of said twelfth transistor, so that the collectors of said fifteenth and sixteenth transistors output said pair of complementary slave input data signals.

10. A flipflop circuit according to claim 9, wherein said master latch/hold circuit further includes a fifth resistor connected between said second power supply voltage and the common-connected one ends of said first and second resistors, and wherein said slave latch/hold circuit further includes a sixth resistor connected between said second power supply voltage and the common-connected one ends of said third and fourth resistors.

\* \* \* \* \*